(12) United States Patent
Chopra et al.

(10) Patent No.: US 7,425,826 B2
(45) Date of Patent: Sep. 16, 2008

(54) SELECTIVELY CONDUCTIVE STRUCTURE WHEREIN A MAGNETIC CONDUCTOR IS SIZED TO HAVE A CROSS-SECTION DIAMETER SIMILAR TO A FERMI WAVELENGTH OF ELECTRONS

(76) Inventors: Harsh Deep Chopra, 310 Renaissance Dr., Williamsville, NY (US) 14221; Zonglu Hua, 310 Renaissance Dr., Williamsville, NY (US) 14221; Matthew R. Sullivan, 311 Oakdale Dr., Rochester, NY (US) 14618; Jason N. Armstrong, 351 Lafayette Rd., Groton, NY (US) 13073

( * ) Notice: Subject to any disclaimer, the term of this patent is extended or adjusted under 35 U.S.C. 154(b) by 392 days.

(21) Appl. No.: 11/355,626

(22) Filed: Feb. 16, 2006

(65) Prior Publication Data

US 2006/0261800 A1 Nov. 23, 2006

Related U.S. Application Data

(60) Provisional application No. 60/692,653, filed on Jun. 20, 2005, provisional application No. 60/653,331, filed on Feb. 16, 2005.

(51) Int. Cl.
*G01R 33/02* (2006.01)
*G01R 33/12* (2006.01)
(52) U.S. Cl. .................................. 324/252; 324/210
(58) Field of Classification Search ......... 324/210–212, 324/244–252
See application file for complete search history.

(56) References Cited

U.S. PATENT DOCUMENTS

| 5,695,864 A | * | 12/1997 | Slonczewski | 428/212 |
| 5,780,135 A | * | 7/1998 | Kikitsu et al. | 428/834 |
| 5,856,681 A | * | 1/1999 | Ohshima | 257/25 |

* cited by examiner

*Primary Examiner*—Jay M Patidar
(74) *Attorney, Agent, or Firm*—Hodgson Russ LLP

(57) ABSTRACT

The invention includes a conductor with a first side and a second side. The conductor may be sized to have a cross-section diameter substantially similar to a Fermi wavelength of electrons in the conductor, the cross-section diameter being taken substantially perpendicular to a primary direction in which current could flow through the conductor. The conductor size may be selected so that when a magnetic field less than a threshold value is applied to the conductor, the first side of the conductor has a first magnetic state and the second side of the conductor has a second magnetic state. However, when a magnetic field of sufficient strength is applied to the magnetic conductor the first side and the second side will be caused to have the same magnetic state. The material of the conductor may be selected from those for which magnetoresistance magnitude of the material oscillates as a function of the material's cross-sectional area, and the cross-sectional area of the conductor may be selected to correspond to a peak of the function.

21 Claims, 12 Drawing Sheets

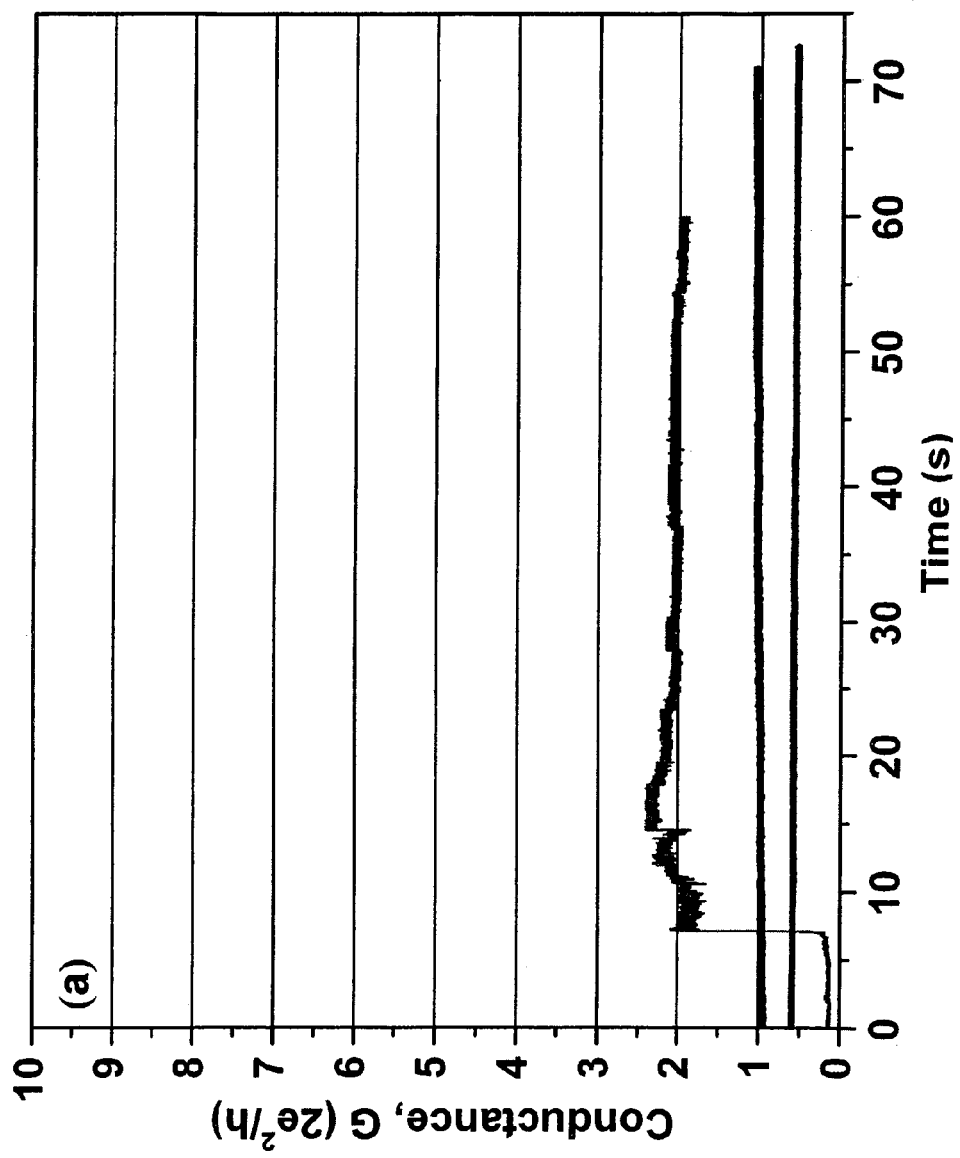
Figure 1(a) (ENLARGED)

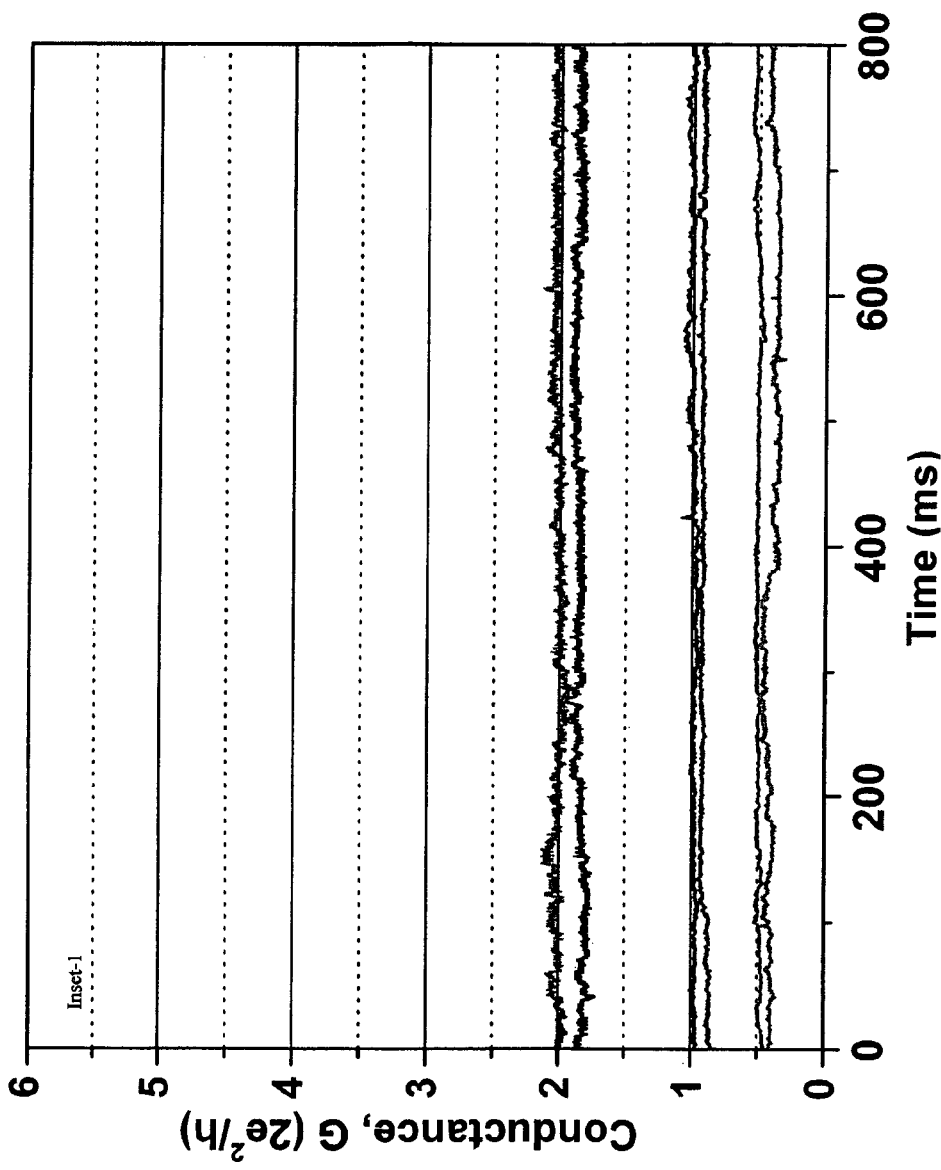
Inset-1 of Figure 1(a) (ENLARGED)

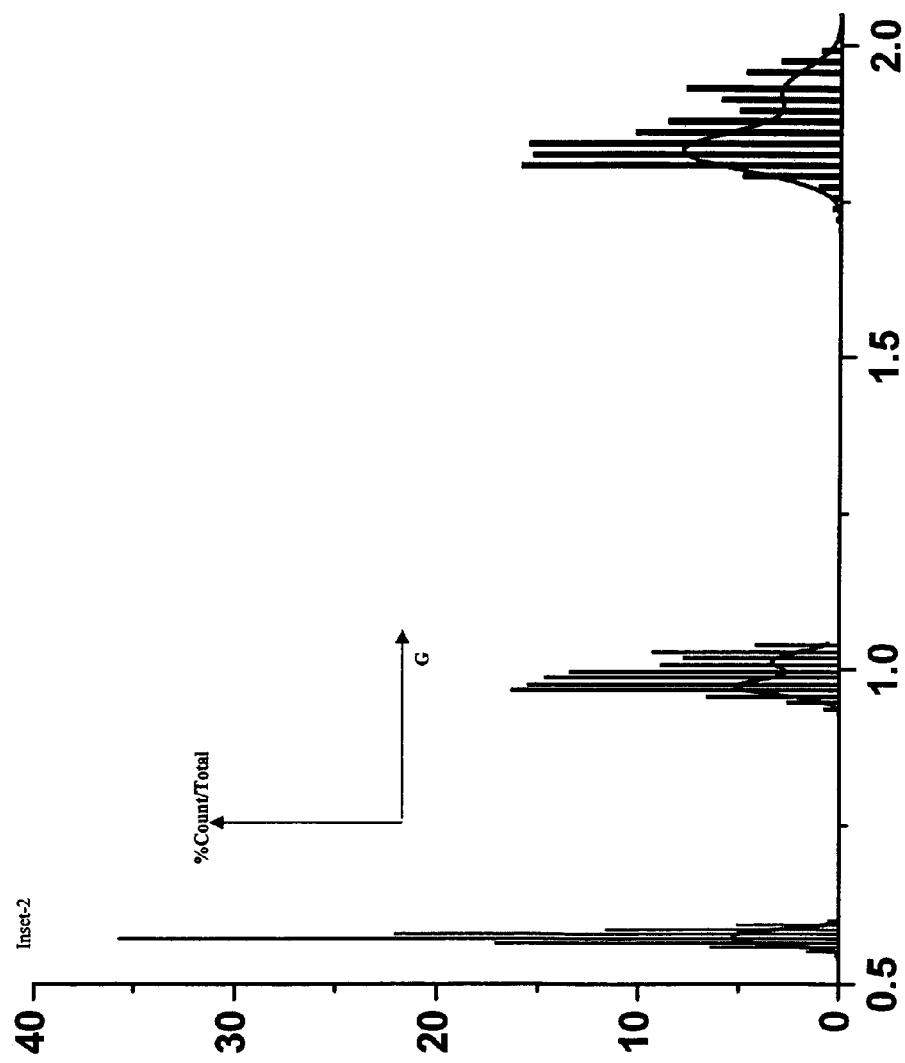
Inset-2 of Figure 1(a) (ENLARGED)

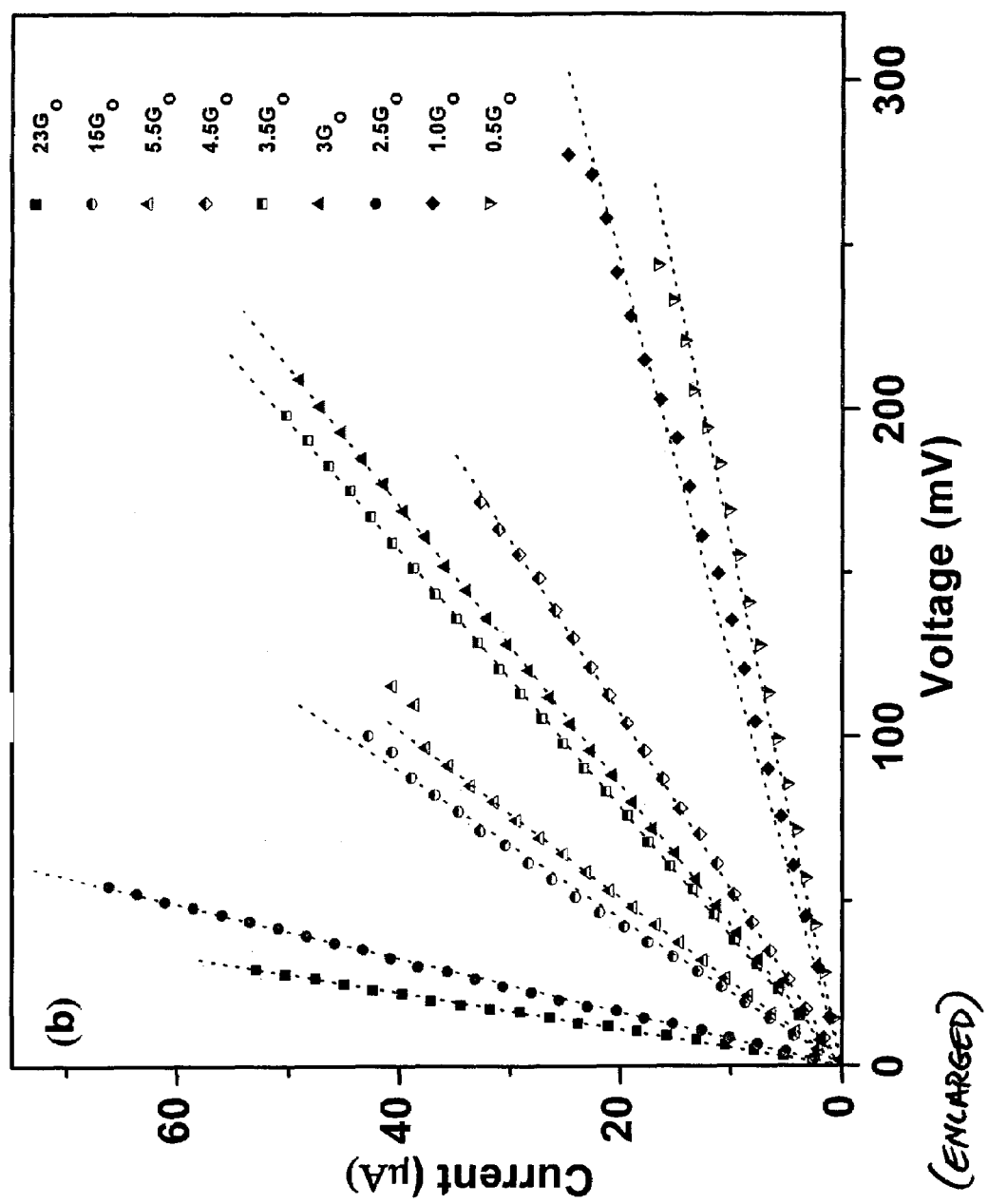
Figure 1(b) (ENLARGED)

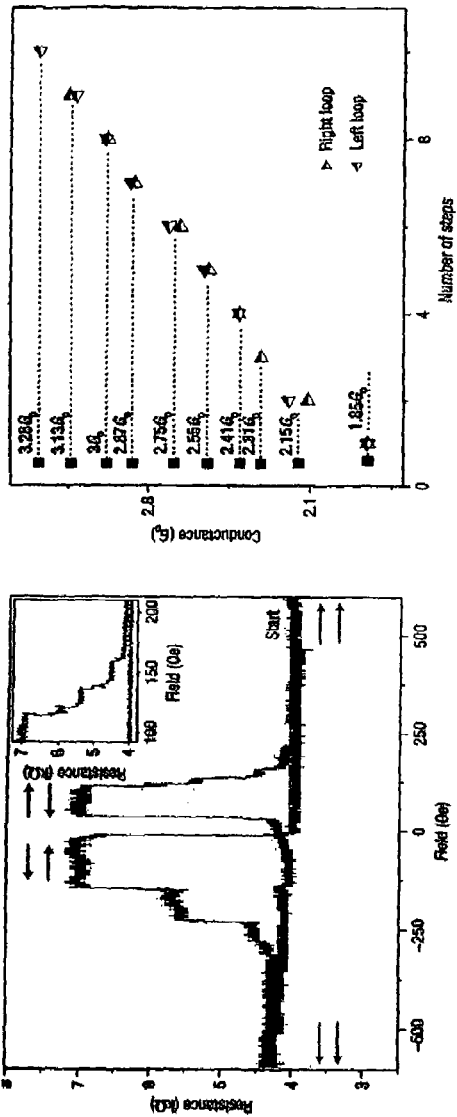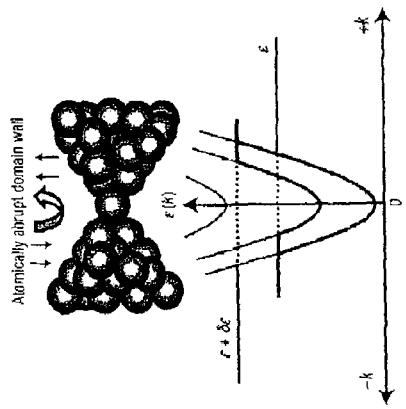
FIG. 3A
FIG. 3B
FIG. 3C

SELECTIVELY CONDUCTIVE STRUCTURE WHEREIN A MAGNETIC CONDUCTOR IS SIZED TO HAVE A CROSS-SECTION DIAMETER SIMILAR TO A FERMI WAVELENGTH OF ELECTRONS

CROSS-REFERENCE TO RELATED APPLICATION

This application claims the benefit of priority to U.S. provisional patent application Ser. Nos. 60/653,331, filed on Feb. 16, 2005 and 60/692,653, filed on Jun. 20, 2005.

FIELD OF THE INVENTION

The present invention relates to devices for conducting electricity and controlling the flow of electrons.

BACKGROUND OF THE INVENTION

Materials that change their electrical resistance in response to a magnetic field may be used in magnetic sensors for a range of applications. For example, such magnetic sensors may be used in a computer to retrieve stored data. In some of those storage devices, data is stored magnetically on a disk. For example, a binary "1" may be stored as a first magnetic state and a binary "0" may be stored as a second magnetic state. When the disk is rotated, a sensor may be brought in close proximity to the rotating disk to determine the magnetic state of the disk at different locations on the disk. The binary ones and zeros sensed by the sensor may be concatenated and provided to a microprocessor as a data stream. The microprocessor may be programmed to interpret the data stream, and use that data to accomplish a task.

There is a desire to have magnetic sensors that are highly sensitive. For example, with respect to data storage devices for computers there is a desire to store more data in the same space. In order to magnetically store more data in a given space, the magnetic zones on the disk may be moved closer together and made smaller. However, if the magnetic zones are moved closer together and smaller, existing sensors may not be able to distinguish one magnetic zone from another, either because the zones are too close or because the magnetic field from a zone is too weak, or both. As a result, there is a desire to have magnetic sensors that are more sensitive.

There are other situations in which it would be desirable to have magnetic sensors that are more sensitive than currently existing devices. For example, it may be desirable to have highly sensitive magnetic sensors employed to detect weak signals from submarines, or to measure variations in the earth's magnetic field.

Around 1988, a so-called 'giant' magnetoresistance or GMR effect was discovered. The term "giant" was selected to indicate that a large change in resistance was observed in response to an applied magnetic field. The change in resistance was observed to be from tens to hundreds of percent. The GMR based devices, along with another type of device commonly referred to as Magnetic Tunnel Junctions ("TMJ"), have been applied in the design of read-head sensors for computer data storage devices. For example, the design of Magnetic Random Access Memories ("MRAM") is influenced by GMR and TMJ. As a result, some MRAMs often include layers of films, each film being a few atoms thick.

In 1999, a large ballistic magnetoresistance (BMR) effect was observed in Ni quantum point conductors. Since then, the effect has been observed in other systems, such as Co and half-metal $Fe_3O_4$.

SUMMARY OF THE INVENTION

The invention may be embodied as a selectively conductive structure. The structure may have a first electrode, a second electrode and a magnetic conductor. An insulator may reside between the first electrode and the second electrode, and the magnetic conductor may extend through the insulator. The magnetic conductor has a first side and a second side. The first side of the magnetic conductor may be electromagnetically coupled to the first electrode and the second side of the magnetic conductor may be electromagnetically coupled to the second electrode. To establish the electromagnetic coupling, the magnetic conductor, the first electrode and the second electrode may be physically joined to each other to form a unitary structure in which the first side is joined to the first electrode and the second side is joined to the second electrode.

The magnetic conductor may be sized to have a cross-section diameter similar to the Fermi wavelength of electrons in the magnetic conductor. It is believed that such a magnetic conductor will have a cross-section that has 25 or fewer atoms in its cross-section. By doing so, the conductance (or resistance) is not continuous but quantized (takes certain discrete values), herein referred to as "quantized conductance." The first side of the magnetic conductor may have a first magnetic state and the second side of the magnetic conductor may have a second magnetic state. When the magnetic state of the first side differs from the magnetic state of the second side, the magnetic conductor will be relatively non-conductive. However, when a magnetic field of sufficient strength is applied to the magnetic conductor, the magnetic state of the first side will be similar to the magnetic state of the second side, and the magnetic conductor will be relatively conductive. To summarize, in such a device, the magnetic conductor will be relatively nonconductive when the magnetic state across the magnetic conductor is different and relatively conductive when the magnetic state across the magnetic conductor is the same. In order to apply a magnetic field to the magnetic conductor, a magnetic field may be generated, for example via an electromagnet or a permanent magnet, or through a current coil, and the magnetic conductor may be positioned in the magnetic field.

The material of the magnetic conductor may have the characteristic that its magnetoresistance magnitude oscillates as a function of the material's cross-sectional size of the magnetic conductor. For a given material, the size of the magnetic conductor may be selected to be at or near a peak of the function, and thereby correspond substantially to a peak of the function.

The term "cross-section" is used herein with respect to the magnetic conductor to reference a cross-section of the magnetic conductor taken substantially perpendicular to a primary direction in which current could flow through the conductor.

The invention may also be embodied as a data retrieval device having a magnetic conductor according to the invention.

BRIEF DESCRIPTION OF THE DRAWINGS

For a fuller understanding of the nature and objects of the invention, reference should be made to the accompanying drawings and the subsequent description. Briefly, the drawings are:

FIG. 1A shows conductance traces for cobalt magnetic conductors at nominal values of $0.5G_o$, $1G_o$, and $2G_o$. Slight deviations in the measured conductance from the nominal values of the respective conductance plateaus are shown in Inset-1 of FIG. 1A for six different cobalt magnetic conductors, two each for magnetic conductors stabilized at or near the nominal values of $0.5G_o$, $1G_o$ and $2G_o$. Inset-2 of FIG. 1A shows the statistical spread corresponding to the three conductance traces in FIG. 1A. The curves appearing in the statistical spreads of Inset-2 are Gaussian fit to the distributions shown in Inset-2. FIG. 1B shows I-V curves at various magnetic conductor sizes as small as a single atom, and with or without spin-splitting. The dotted lines in FIG. 1B show the linear fits to the measured I-V curves. With respect to Inset-2, the term "size" refers to the cross-section of the magnetic conductor, expressed in terms of the quantized value of its conductance.

FIGS. 3A through 3F show magnetoresistance loops having step-changes in resistance with applied magnetic field in cobalt magnetic conductors of various sizes. FIG. 3A shows the magnetoresistance loop of a cobalt magnetic conductor having a nominal value of $3G_o$ at saturation. Here saturation refers to applied field being sufficiently large to produce the same magnetic state across the magnetic conductor. The stepwise nature of the magnetoresistance in the magnetic conductor is highlighted in the Inset of FIG. 3A for a section of the magnetoresistance loop in the positive field quadrant. FIG. 3B shows values of the stepwise conductance depicted in FIG. 3A. Arrows pointing to the right in FIG. 3B represent the positive field direction, and arrows pointing to the left in FIG. 3B represent the negative field direction. FIG. 3C is a schematic of a magnetic conductor having a domain wall, and discrete energy levels ("channels") due to the transverse confinement of the electron waves. The direction of the applied magnetic filed is in the horizontal direction along the axis of the magnetic conductor. In FIG. 3C, $\epsilon$ is the energy and k is the wave vector. FIGS. 3D, 3E and 3F show curves of magnetoresistance loops for the cobalt magnetic conductor with nominal values of $4G_o$, $5G_o$ and $1G_o$, at saturation, respectively.

Figure 1A:
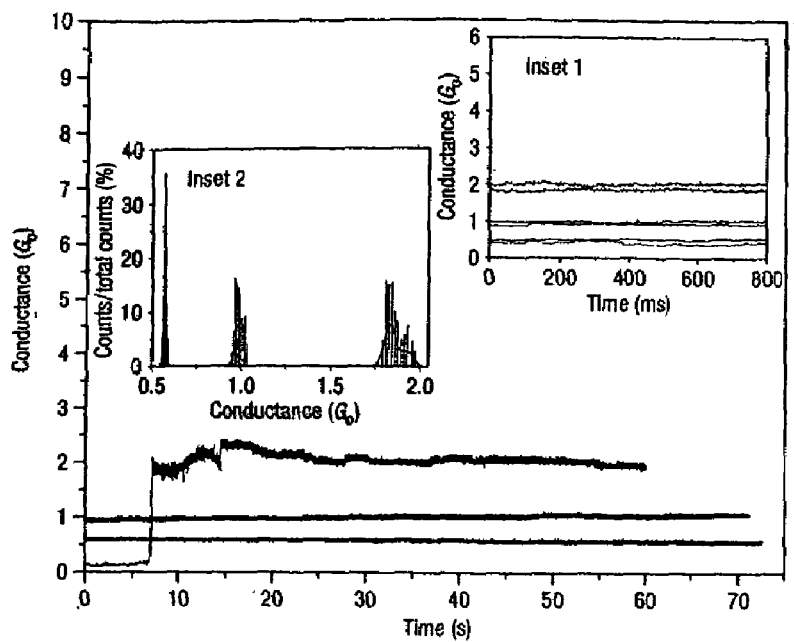
FIGS. 1A and 1B show electrical properties of cobalt magnetic conductors of various sizes, with the magnetic conductors in the spin-split state formed in the presence of a constant magnetic field of approximately 600 Oe.
Figure 1B:
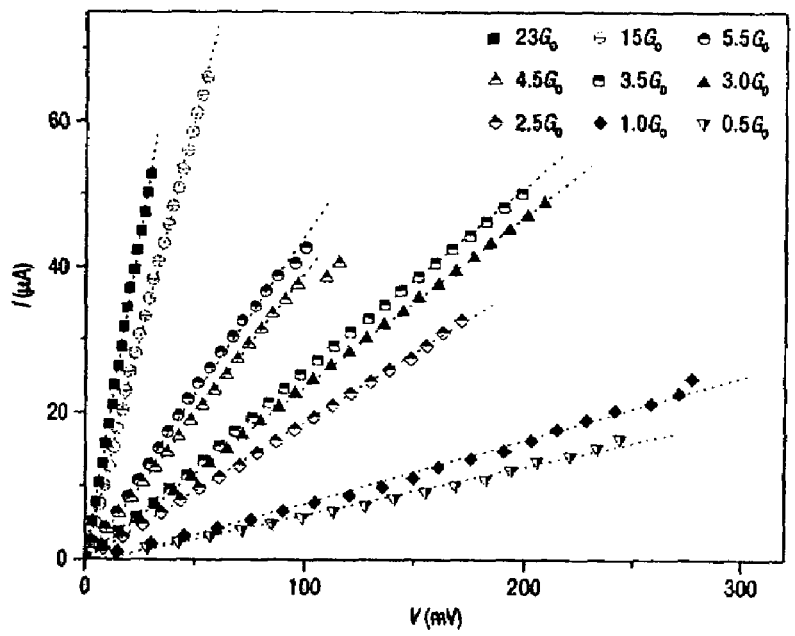

Enlarged versions of FIGS. 1A and 1B, and their Insets are also provided for clarity.

FURTHER DESCRIPTION OF THE INVENTION

Monovalent systems, such as gold, have atoms that have only one conductance channel per atom. By contrast, a single atom of a magnetic material can have multiple or fractional number of conductance channels for each atom. However, when a single atom of a magnetic material is used, the magnetic properties across the atom may interact with the spin states of the transmitting electrons across the atom. This interaction modifies the conductance across the atom, and can be used to alter the conductance across the atom. Hence, the conductance across an atom may be altered by altering the magnetic state across the atom. Integration of quantized conductance and spin-dependent transport across a magnetic atom may give rise to a multi-channel system across which transmission of electron waves can be regulated. Regulating transmission of electron waves may be accomplished by selectively creating a "domain wall" defining a boundary between one magnetic state and another magnetic state. When the domain wall exists in a magnetic conductor, transmission of electron waves may be inhibited and there may be significant backscattering of electron waves, but when the domain wall does not exist in the magnetic conductor, transmission of electron waves may be accomplished more easily and the amount of backscattering is reduced.

Figure 5:
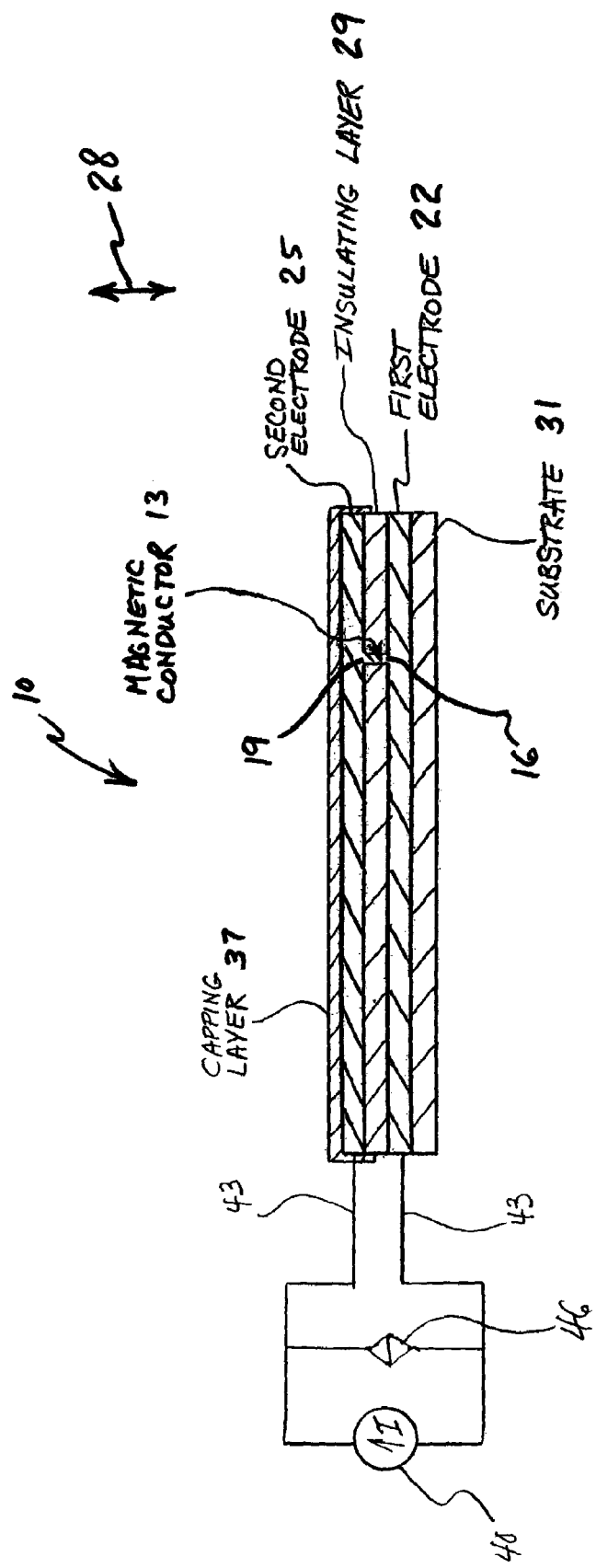
FIG. 5 schematically depicts a structure according to the invention.

The invention may be embodied as a selectively conductive structure 10 having a magnetic conductor 13 with a first side 16 and a second side 19. One such structure 10 is depicted in FIG. 5. The structure 10 may include a first electrode 22 that is electromagnetically coupled to the first side 16 of the magnetic conductor 13. For example, the first electrode 22 may be joined to the first side 16 of the magnetic conductor 13. The structure 10 may also include a second electrode 25 that is electromagnetically coupled to the second side 19 of the magnetic conductor 13. For example, the second electrode 25 may be joined to the second side 19 of the magnetic conductor 13.

The magnetic conductor 13 may be sized to have a cross-section diameter that is substantially similar to a Fermi wavelength of electrons in the magnetic conductor 13. The term "cross-section" is used herein to refer to a cross-section taken substantially perpendicular to a primary direction 28 of current flow through the magnetic conductor 13.

The size of the magnetic conductor 13 may be selected to provide quantized conductance. Furthermore, the size of the magnetic conductor 13 may be selected to make selective formation of a domain wall easier. By affording the ability to selectively form a domain wall, the conductance of the magnetic conductor 13 may be selectively altered.

The ability to regulate using a domain wall may be achieved in a magnetic conductor 13 which has a cross-section diameter that is similar to the Fermi wavelength of electrons. For example, selective formation of a domain wall may be achieved when the cross-section of the magnetic conductor 13 is a single atom. However, selective formation of a domain wall may be achieved when the magnetic conductor's 13 cross-section is comprised of many more atoms. We have observed the effects of domain walls in magnetic conductors 13 having as many as 16 atoms in the magnetic conductor 13 cross-section.

In a device according to the invention, electric current may be caused to flow through the magnetic conductor 13 and the conductivity (or alternatively, the resistivity) of the magnetic conductor 13 may be sensed as a function of a magnetic field applied to the magnetic conductor 13. Since conductivity is the inverse of resistivity, in this document will we refer to one or the other, with the understanding that either may be used.

As an example, consider a data storage device in which the read-head includes a magnetic conductor 13 according to the invention. Data may be stored on a storage medium, such as a disk, in magnetic binary form. As a magnetic bit comes close to or contacts the read-head, the read-head may detect the resistance afforded by the magnetic conductor 13. If the resistance is high, then the bit is determined to be of a particular first type, but if the resistance is low, then the bit is determined to be a particular second type. For example, a high resistance in the magnetic conductor 13 may be interpreted to be a binary "1", while a low resistance in the magnetic conductor 13 may be interpreted to be a binary "0". Of course, whether a high resistivity is interpreted to be a "1" or a "0" is an arbitrary choice, and the invention may be practiced such that high resistivity represents a "0" and low resistivity represents a "1". Further, in keeping with statements made elsewhere in this document, conductivity of the magnetic conductor 13 may be used in lieu of resistivity.

It is believed that selective conductance resulting from the use of a domain wall in a magnetic conductor 13 may be achieved because the domain wall is not wide. That is to say that the first side 16 of the magnetic conductor 13 has a magnetic state that is different from the magnetic state on the second side 16 of the magnetic conductor 13 and the transition between the two magnetic states occurs over a small distance. The domain wall may be thought of as the area of the magnetic conductor 13 where the magnetic states change. The width of the domain wall is defined herein with respect to the primary direction 28 of current flow, and when the domain wall width dimension is small, the transition from the magnetic state of the magnetic conductor's 13 first side 16 to the magnetic state of the magnetic conductor's 13 second side 16 is relatively abrupt as one moves from the first side 16 to the second side 19. The resistance afforded by a domain wall with a small width tends to be very high relative to a domain wall with a larger width dimension. Consequently, a magnetic conductor 13 that is able to produce a domain wall with a small width should result in a greater difference in conductance (or resistance) between the state where a domain wall exists and the state where no domain wall exists. A greater difference in conductance (or resistance) should be easier to detect, thereby making it easier to detect the magnetic state of the thing being sensed by a device according to the invention. We have found that the width of a domain wall tends to be about the same as the cross-section diameter of the magnetic conductor 13. Consequently, the ability to selectively create a suitable domain wall may depend on the cross-section diameter of the magnetic conductor 13.

As used herein, the size of the magnetic conductor 13 is sometimes described with reference to a "diameter", but it should be recognized that the magnetic conductor 13 need not be circular. In a non-circular magnetic conductor 13, the term "diameter" may be considered as identifying an equivalent diameter—that is to say that the "diameter" of a non-circular magnetic conductor 13 is that diameter which would produce a circular magnetic conductor 13 of similar cross-sectional area.

The materials used to form the magnetic conductor 13 may exhibit the property that the magnetoresistance oscillates as a function of the diameter of the magnetic conductor 13. Consequently, there are certain diameters for which formation of a domain wall will be relatively easy. Those diameters for which formation of a domain wall is relatively easy may exhibit anti-ferromagnetic coupling without applying a magnetic field. In practice, due to hysteresis effects, anti-ferromagnetic coupling may be achieved as long as the applied magnetic field is less than a threshold value for the material being used.

In contrast, there may be certain diameters for which formation of a domain wall will be very difficult. Those diameters for which formation of a domain wall is very difficult may exhibit ferromagnetic coupling regardless of whether a magnetic field is applied.

Therefore, the materials used to form the magnetic conductor 13 may exhibit the property that the magnetoresistance oscillates as a function of the cross-sectional area of the magnetic conductor 13. By choosing the diameter of the magnetic conductor 13, the magnetic conductor 13 may exhibit anti-ferromagnetic coupling and hence naturally form a domain wall in the magnetic conductor 13. Consequently, by carefully choosing the diameter of the magnetic conductor 13, the magnetic conductor 13 may be made to have a high resistance without application of a magnetic field, and that same conductor may be made to have a low resistance by applying a magnetic field of sufficient strength.

To illustrate an embodiment of the invention, consider that a magnetic conductor 13 may be made at room temperature by electrodeposition of Co between two narrowly spaced (200-500 nm) microfabricated Co thin films 1-2 μm thick, using a cobalt sulfamate solution (75 g/l Co as metal in $Co(SO_3NH_2)_2 \cdot 2H_2O$; 30 g/l boric acid, pH 3.2 to 3.3). The size of the magnetic conductor 13 may be controlled using a self-termination method, which is capable of forming stable magnetic conductors 13 to a size-resolution of a single atom. The deposition voltage may be between 0.6 to 1.0 V. In order to test the resulting magnetic conductor 13, magnetoresistance measurements may be made at voltages between 100 to 350 mV (10-30 μA). By cycling the samples in a magnetic field at a low cycling rate of 0.2 Hz, magnetoresistance loops for the magnetic conductors 13 may be created and analyzed.

As protection against oxidation, a magnetic conductor 13 according to the invention may be submerged in de-ionized ultra-filtered water following its formation or buried inside an electrically insulating medium 29.

FIG. 1A shows conductance traces for magnetic conductors 13 stabilized at 1 $G_o$ and 2 $G_o$, as well as the spin-split $$\frac{1}{2}G_o$$

quantized conductance plateau (the latter having been formed in the presence of a constant magnetic field ~600 Oe); 1 $G^o=2e^2/h=7.748091 \times 10^{-5}$ siemens $$\left(\frac{1}{12906}\Omega^{-1}\right),$$

where e is the electron charge and h is Planck's constant. A closer examination of the conductance plateaus obtained from hundreds of experiments reveals that the actual conductance value may differ slightly from the nominal value of conductance at a given plateau. For example, different magnetic conductors 13 stabilized at a nominal value of 1 $G_o$ tend to randomly take values ranging from approximately 0.85 to 1.1 $G_o$, while a magnetic conductor 13 stabilized at the nominal $\frac{1}{2}G_o$ conductance plateau assume values between ≈0.37 to 0.52 $G_o$, etc. Inset-1 in FIG. 1A shows six examples, two each for Co magnetic conductors 13 that have stabilized at or near the nominal values of $\frac{1}{2}G_o$, 1 $G_o$, and 2 $G_o$. Small deviations from nominal values are well-studied and result from interference (constructive or destructive) between the primary transmitted electron waves with the secondary waves arising from scattering in the diffusive bands. Presence of a domain wall across a magnetic conductor 13 made of magnetic atoms can lead to a further deviation from the nominal value as discussed below.

The magnetic conductors 13 described above may be used to generate data derived over a minute (see FIG. 1A), and these data show the quantized conductance plateaus, thereby obviating the need to indirectly infer the presence of quantized conductance through a statistical compilation of a large number of statistics. Using our invention, the observed quantized conductance levels for a given magnetic conductor 13 corresponded with the statistical peak observed when a statistical compilation of quantized conductance was done in a large number of mechanically established (prior art) conductors.

Inset-2 in FIG. 1A further shows the statistical distribution and narrow spread in the conductance for magnetic conductors 13 in FIG. 1A that were stabilized at $\frac{1}{2}G_o$, 1 $G_o$, and 2 $G_o$. FIG. 1B shows the measured current-voltage ("I-V") curves for Co magnetic conductors 13 as small as a single atom, with and without spin-splitting. Within the range of applied voltages, FIG. 1B shows a negligible deviation from the linear curve fit (dotted lines). It is believed that whether linear or a non-linear I-V curves are produced depends on the experimental conditions, and whether any oxide or other adsorbed species are present. For magnetic conductors 13 exposed to air or with an oxide layer, non-linear behaviour is the norm. However, for bare metal surfaces where the magnetic conductor 13 is never exposed to air, linear behavior has been observed.

Figure 2:
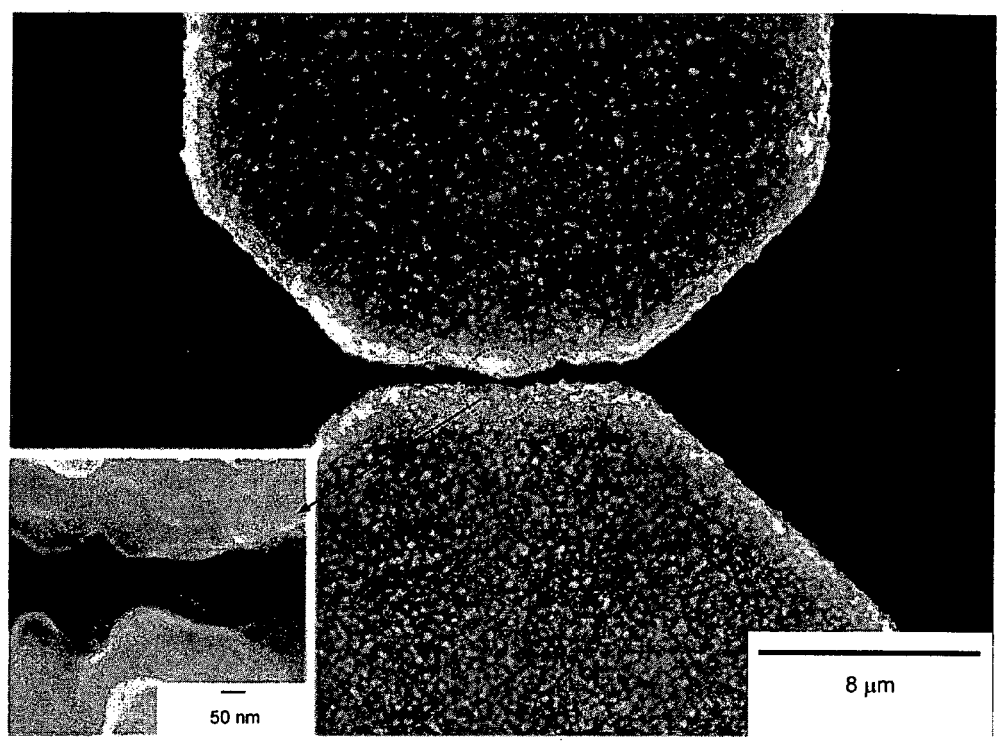
FIG. 2, is a low-magnification scanning electron microscope image of two electrodes between which a cobalt magnetic conductor of $0.5G_o$ conductance was electrodeposited. A tip was intentionally microfabricated on one of the two electrodes (shown circled) in order to concentrate the electric field for preferential electrodeposition of the magnetic conductor across the electrodes. The Inset of FIG. 2 shows a high-magnification image of the growth morphology. The actual magnetic conductor broke before imaging and only a gap (instead of the magnetic conductor) can be seen between the two electrodes in the magnified image.

FIG. 2 shows a low magnification scanning electron microscope ("SEM") image of the electrodes following the growth of a $\frac{1}{2}G_o$ point conductor across them. The Inset in FIG. 2 shows the morphology of the magnetic conductor 13 (broken) at high magnification.

We have observed that as-deposited point conductors with no magnetic field applied either show antiferromagnetic ("AF") or ferromagnetic ("F") coupling across the magnetic conductor 13 depending on the magnetic conductor's 13 cross-section diameter. The AF aligned state results in the formation of a domain wall across the magnetic conductor 13. The electron transmission probability for the F state is different from the electron transmission probability for the AF state because the number of conductance channels for the F state is different from the number of conductance channels for the AF state. When the magnetic conductor 13 is formed to have a naturally occurring AF state, the magnetic conductor 13 may be caused to have an F state by applying a magnetic field of sufficient strength, and therefore, the number of conductance channels may be altered by applying such a magnetic field.

FIG. 3A shows field-dependent opening and closing of conductance channels across a Co magnetic conductor 13 with a nominal conductance of 3 $G_o$. Following saturation in the positive direction, FIG. 3A shows that as the field strength is reduced toward zero, the resistance remains constant. When the field increases in strength in the negative direction, the resistance increases corresponding to spontaneous reversal of magnetization from the F state to the AF state, leading to the formation of an abrupt domain wall across the magnetic conductor 13. In one embodiment of the invention, the measured resistance when a domain wall was present was 85% higher than the resistance measured when a domain wall was not present. Note that unlike conventional domain walls that are often hundreds of nanometers wide, the domain walls of a magnetic conductor 13 according to the invention may be much smaller, and are usually between one and 16 atomic diameters in width.

In FIG. 3A, the high-resistance plateau persists, until the field reaches −130 Oe at which point the alignment of magnetization found at the domain wall begins to change, and the domain wall begins to disappear. However, the resulting decrease in resistance is not continuous with field—instead, there is a stepwise change in the resistance provided by the magnetic conductor 13. In FIG. 3A, it will be noticed that there are portions of the loop which are independent of the magnetic field, and these portions are bounded by step-changes in resistance to the next resistance plateau. The step-change is a unique feature of magnetic conductors 13 according to the invention, and may be contrasted with the more continuous magnetoresistance change observed in larger conductors where only ballistic transport prevails.

It should be noted from FIG. 3A that when the magnetic field reaches negative saturation, the domain wall disappears from the magnetic conductor 13. Also from FIG. 3A, it should be noted that the resistance at negative saturation becomes approximately equal to the resistance at positive saturation. When the field strength is reduced from saturation back toward zero, the resistance remains substantially constant and field-independent since in this segment of the hysteresis loop no domain wall is present across the magnetic conductor 13. However, when the field is cycled past zero and increased in the positive direction, at a threshold value of the magnetic field the resistance rises and the magnetization across the magnetic conductor 13 flips to the AF state leading to the formation of a domain wall across the magnetic conductor 13. The behavior of the resulting domain wall in an applied magnetic field is substantially the same as that described for the negative field cycle, and at a sufficiently high field the resistance reversibly returns back to its starting value. The observed spin-valve behavior in FIG. 3A as a function of applied magnetic field results from a change in the number (or probability) of the transmitting channels due to a domain wall across the magnetic conductor 13. Even though minor loops or pulsed excitation of magnetoresistance has been previously reported, measurement of complete magnetoresistance loops in magnetic conductors 13 themselves apart from mechanical artifacts, without the need for any additional empirical evidence. This is because magnetic artefacts behave the same way in either direction rather than showing a field-dependent segment from zero to positive (or negative) saturation and a field-independent behaviour upon returning from positive (or negative) saturation back to zero, where the domain wall is absent.

Corresponding to both halves of the loop in FIG. 3A, the system takes an equal number of steps in going from either zero to negative saturation, or from zero to positive saturation and the values of these steps are substantially identical, as shown in FIG. 3B. In a metal point conductor joined on each side by electrodes (see FIG. 3C) where the Fermi wavelength is of the order of 0.5 nanometers or less, the behaviour of propagating electrons can be expressed by transversely confined and freely propagating longitudinal wave-functions. The transverse confinement of the electron wave functions (commonly referred to as "modes") by the magnetic conductor 13 diameter gives rise to discrete sub-bands or channels, within which the parabolic momentum terms shown in FIG. 3C represent the contribution due to the free propagation along the longitudinal direction. The integration over all available channels gives rise to the observed conductance. The presence of an abrupt domain wall across the magnetic conductor 13 illustrated in FIG. 3C causes the number of transmitting channels to differ between AF and F aligned states, and this difference in the number of transmitting channels gives rise to the magnetoresistance step-changes observed in the data used to create FIG. 3A.

Figure 3D:
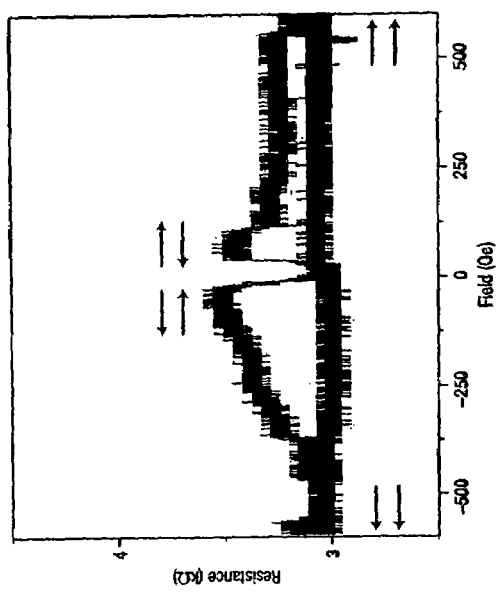
Figure 3F:
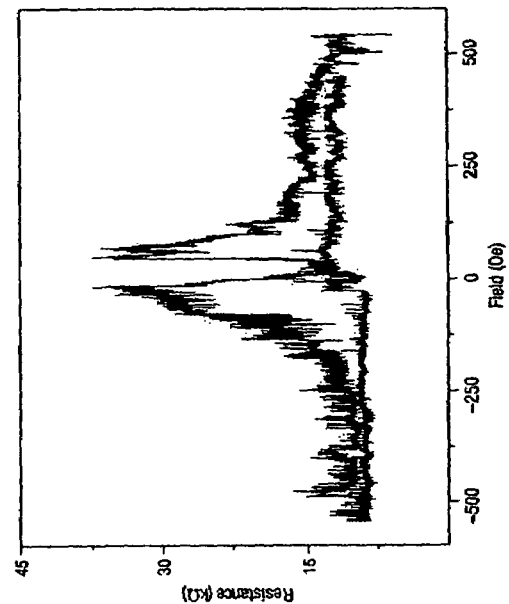
Figure 3E:
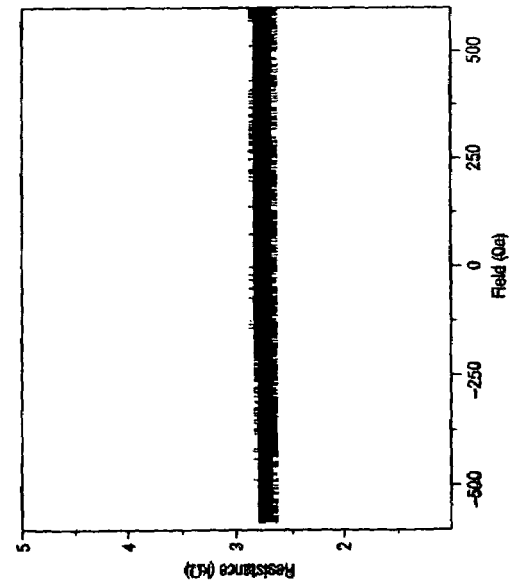

As the diameter of the magnetic conductor 13 increases, the ability to establish an "abrupt" domain wall (a domain wall with a small width) becomes more difficult because as the size of the magnetic conductor 13 increases, the width of the domain wall also increases. FIG. 3D shows the magnetoresistance loop following the growth of the magnetic conductor 13 to the next higher conductance plateau at 4 $G_o$. The hysteresis characteristics in FIG. 3D are similar to those described in FIG. 3A. However, in FIG. 3D an increase in conductance by just one quantized level causes the magnetoresistance to drop to only 25%. FIG. 3E shows that when the magnetic conductor 13 is grown to the next higher conductance plateau of 5 $G_o$, the magnetoresistance essentially vanishes. The trend in FIGS. 3A, 3D and 3E points to enhanced magnetoresistance for magnetic conductors 13 stabilized at smaller conductance plateaus where the effect of the domain wall is most prominent. The smallest conductance plateau (without spin-splitting) at which Co can be stabilized is 1 $G_o$, which is the signature of quantized conductance across a single atom. Complete magnetoresistance loops across single-atom magnetic conductors 13 were measured, and a typical curve is shown in FIG. 3F, which shows a difference in magnetoresistance approaching 300%—that is to say that in this situation the resistance when a domain wall existed was 300% greater than when a domain wall did not exist.

Figure 4:
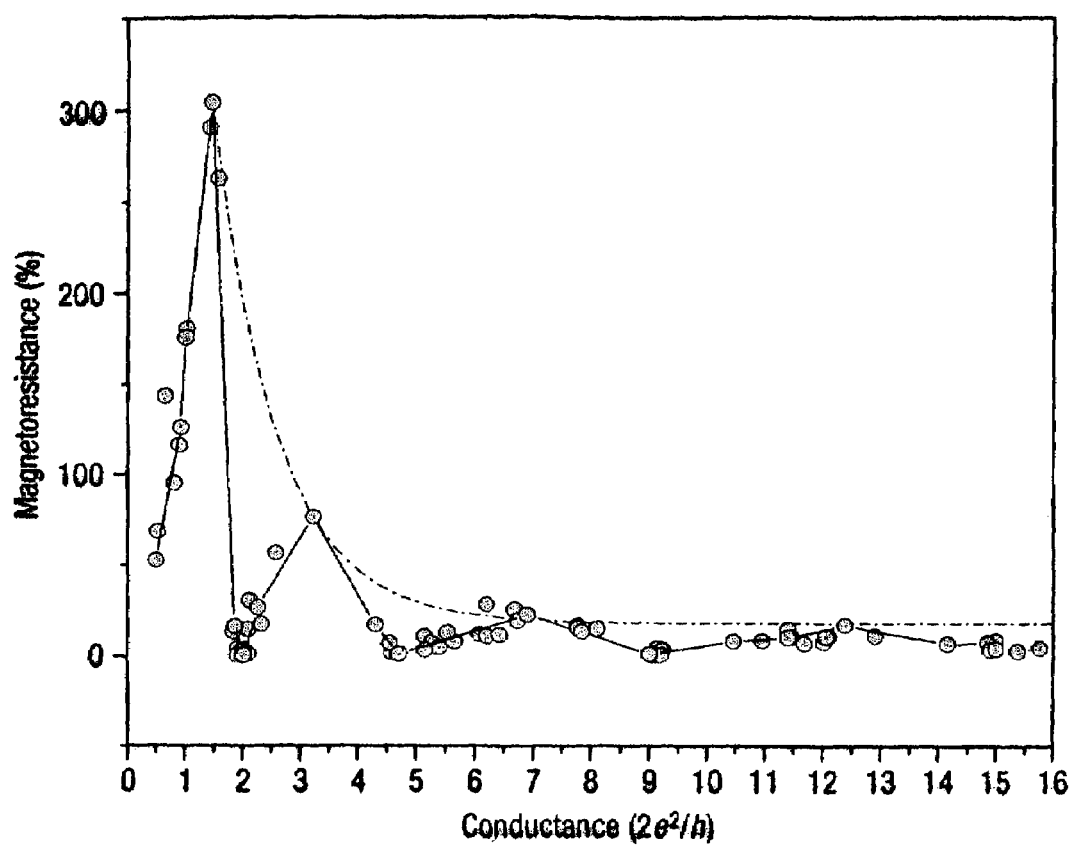
FIG. 4, is a plot showing the oscillatory nature of magnetoresistance as a function of conductance in the high-field (ferromagnetically aligned) state. Each point in FIG. 4 corresponds to an individual magnetoresistance loop. The solid line is drawn as an aid to the eye to trace the oscillations. The dashed line is an exponential decay fit to the four maxima in magnetoresistance versus magnetic conductor size. With respect to FIG. 4, term "size" refers to the cross-section of the magnetic conductor, expressed in FIG. 4 in terms of the quantized value of its conductance.

The dependence of magnetoresistance on the magnetic conductor 13 diameter was systematically studied as a function of magnetic conductor 13 size. FIG. 4 shows magnetoresistance plotted versus conductance of the magnetic conductor 13 in the high field (F-aligned) state. The x-axis in FIG. 4 enumerates the number of quanta of conductance, and since the number of quanta of conductance increases with size, the x-axis of FIG. 4 indirectly identifies the diameter of the magnetic conductor 13. While results in FIG. 3 above point to an overall decay in magnetoresistance with increasing magnetic conductor 13 diameter, an interesting feature of the results shown in FIG. 4 is that the overall decaying magnetoresistance also oscillates as a function of the magnetic conductor 13 size. Four distinct peaks in magnetoresistance can be seen in FIG. 4. The dashed line in FIG. 4 is an exponential decay fit to the four maxima. The first few oscillations in FIG. 4 occur for very small changes in the magnetic conductor 13 diameter (on the order of only a few atoms). These oscillations in magnetoresistance with increasing magnetic conductor 13 diameter are a result of change in the strength of exchange field across domain walls.

The oscillatory nature of magnetoresistance can be observed as a function of increasing magnetic conductor 13 diameter by measuring complete magnetoresistance loops. In such magnetic conductors 13, quantized conductance is normally observed. Previously, magnetoresistance versus conductor-size-plots were developed using pulsed measurements or minor loops, which only yield a rapid decay in magnetoresistance as a function of magnetic conductor 13 diameter. Although the observed overall decay in magnetoresistance in FIG. 4 could be explained by semi-classical domain wall scattering theory, such models do not predict the observed oscillatory behaviour. The explanation of the observed oscillatory magnetoresistance requires a domain wall model with atomically abrupt magnetization gradient, which predicts both an enhanced magnetoresistance by domain walls, as well as oscillations in magnetoresistance similar to those observed in FIG. 4. In such a model, the spin of the conduction electrons cannot undergo precession across atomically abrupt domain walls, and the number of available conductance channels change differently for the F state and the AF state as a function of magnetic conductor 13 diameter. Oscillations in magnetoresistance with respect to conductance quanta (alternatively conductor diameter) occur when the difference between the number of conductance channels in the F state and the AF state changes.

In summary, complete magnetoresistance loops have been measured in magnetic conductors 13 made of Co. The oscillatory magnetoresistance as a function of magnetic conductor 13 size provides evidence for the existence of abrupt domain walls and the ability to selectively establish them. Similar results are expected in other ferromagnetic systems, including magnetic transition metals and half-metals. Transmission through multiple channels of a magnetic single atom can be regulated by selectively establishing a domain wall to form a selectively conductive structure 10 that may be used to detect the magnetic state of an object being sensed.

Such a structure 10 may have a magnetic conductor 13 residing between two electrodes. The magnetic conductor 13 may have a cross-section that includes only a single atom, or as many as 16 atoms, the cross-section being determined by taking a cross-section of the magnetic conductor 13 substantially perpendicular to a primary direction 28 in which current could travel through the magnetic conductor 13. The equivalent area of one such magnetic conductor 13 might be about $\Pi(a)^2/4$, where "$\Pi$" is the mathematical constant pi, and "a" is the diameter of an atom of the material, or the equivalent area might be 16 times larger depending on the material. Such a structure 10 may include magnetic materials in which the oscillatory magnitude of the magnetoresistance is a function of the magnetic conductor's 13 cross-sectional area and the value of its quantized conductance.

Such a structure 10 may have a first electrode 22, a second electrode 22, and a magnetic conductor 13 electromagnetically coupled to the two electrodes. The magnetic conductor 13 may be sized such that the cross-sectional area of the magnetic conductor 13 may be on the order of the area obtained when bisecting an atom, but magnetic conductors 13 many times larger are also within the scope of this invention. It is believed that acceptable results can be obtained by using a magnetic conductor 13 having a cross-sectional area that is less than or equal to the area obtained by closely spacing 25 (or fewer) atoms such that their centers are substantially in a plane, and then bisecting the atoms along the plane.

A magnetic conductor 13 according to the invention may be made from a material that has the characteristic that its magnetoresistance magnitude oscillates as a function of magnetic conductor 13 size. Such oscillatory behavior can be seen in FIG. 4 for Co. For other magnetic materials, the position of the peaks may vary. Peaks can be seen in FIG. 4 at G values between 1 and 2 (first peak), between 2 and 4 (second peak), between 5 and 9 (third peak), and between 10 and 16 (fourth peak). The cross-sectional area of the magnetic conductor 13 may be selected to correspond to a peak of the function. For example, the selected peak may be the second peak of the function. Materials having this characteristic include ferromagnetic metals, ferrimagnetic metals, cobalt, nickel, iron, as well as nickel-iron, nickel-cobalt, cobalt-iron, and half metals such as chromium dioxide ($CrO_2$), or magnetite ($Fe_3O_4$). Alloys of these materials may also have this characteristic.

Figure 6:
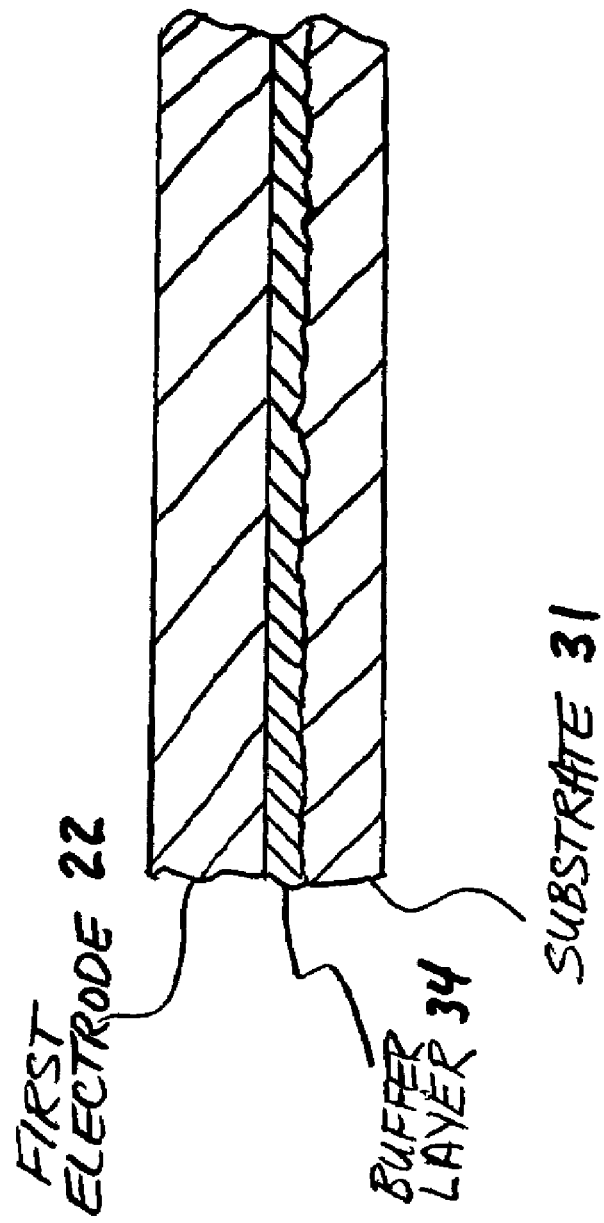
FIG. 6 schematically depicts a portion of the structure depicted in FIG. 5.

A substrate 31 may support the structure 10, or certain of the components comprising the structure 10. FIG. 5 depicts such an arrangement in which the first electrode 22 may be formed on the substrate 31, the magnetic conductor 13 may be formed on the first electrode 22, and the second electrode 22 may be formed on the magnetic conductor 13. FIG. 6 shows a buffer layer 34 between the substrate and the first electrode 22 in order to provide a flat surface on which the first electrode 22 may be formed. The buffer layer 34 may comprise a layer such as Fe, Ru, Cu, Rh, Ir, Ta, or Cr. A capping layer 37 may cover the second magnetic electrode. The capping layer 37 may prevent corrosion of the second magnetic electrode.

The structure 10 may be used as part of a magnetic sensor, for example a read-head in a data retrieval device. A current source 40 may be electrically connected via leads 43 such that the current source 40 is able to provide electric current through the structure 10 in order that electricity is conducted from the first electrode 22, through the magnetic conductor 13 to the second electrode 22. A sensor 46 may be employed to determine the resistance provided by the magnetic conductor 13 and the electrodes 22, 25, or merely the magnetic conductor 13 itself. In a binary storage device, the magnetic field may be provided by a magnetic bit stored on a storage device. As the magnetic bit comes close to the read-head, the magnetic conductor 13 may be placed in the magnetic field of the magnetic bit. If the resistance of the structure 10 is determined to be high, then it may be determined that a zero-bit is indicated by the structure 10, and if the resistance of the structure 10 is determined to be low, then it may be determined that a one-bit is indicated by the structure 10. Of course, the relationship between structure 10 resistance and bit value may be reversed.

Figure 7:
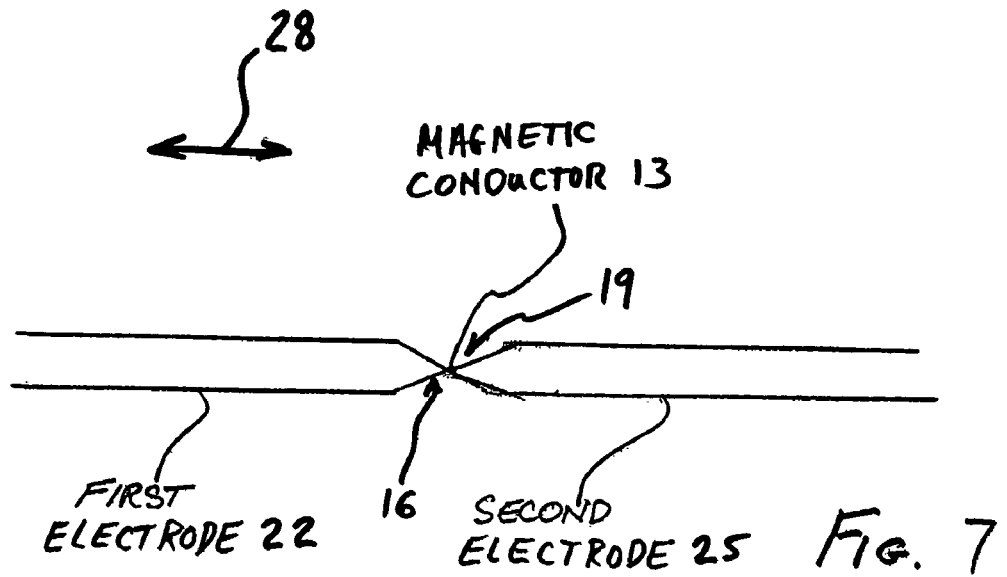
FIGS. 7 and 8 schematically depict structures according to the invention.
Figure 8:
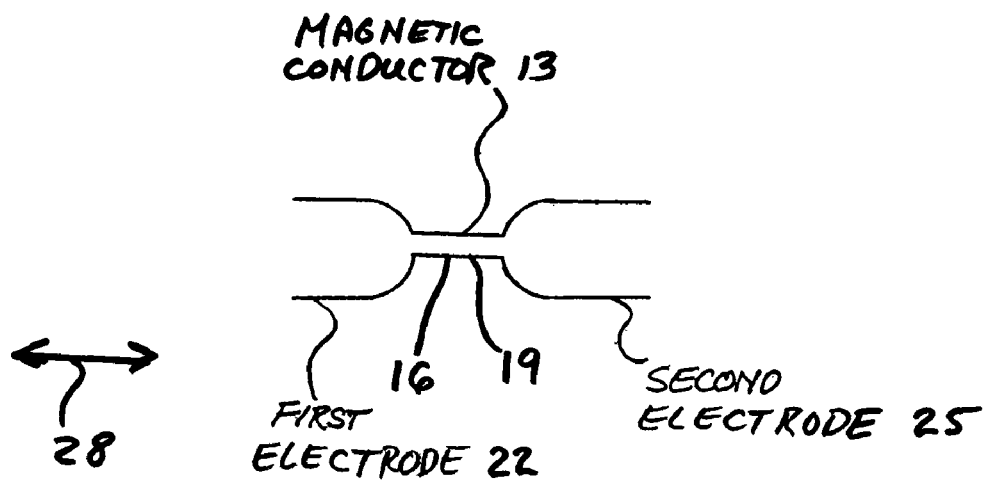

FIGS. 7 and 8 depict additional embodiments of the invention. In FIG. 7, the magnetic conductor 13 has a length that is on the order of one to several atoms long and one to several atoms wide. For clarity, the width of the magnetic conductor 13 is measured substantially perpendicular to a primary direction 28 of current flow and the length of the magnetic conductor 13 is measured substantially parallel to a primary direction 28 of current flow. By way of contrast, in FIG. 8 the magnetic conductor 13 is many atoms long and many atoms wide. It should be understood that embodiments of the invention may be made having the small width of FIG. 7 and the large length of FIG. 8, or the large width of FIG. 8 and the small length of FIG. 7.

U.S. provisional patent application No. 60/653,331 and U.S. provisional patent application No. 60/692,653 disclose additional information and details about the invention and additional embodiments of the invention. The disclosures of those patent applications are incorporated by this reference.

Although the present invention has been described with respect to one or more particular embodiments, it will be understood that other embodiments of the present invention may be made without departing from the spirit and scope of the present invention. Hence, the present invention is deemed limited only by the appended claims and the reasonable interpretation thereof.

What is claimed is:

1. A selectively conductive structure, comprising:
   a first electrode;
   a second electrode;
   an insulating layer residing between the first electrode and the second electrode;
   a magnetic conductor having a first side and a second side, the first side being electromagnetically coupled to the first electrode and the second side being electromagnetically coupled to the second electrode, wherein the magnetic conductor is sized to have a cross-section diameter similar to a Fermi wavelength of electrons in the magnetic conductor, the cross-section being taken substantially perpendicular to a primary direction in which current could flow through the magnetic conductor.

2. The structure of claim 1, further comprising a substrate, and the first electrode is supported by the substrate.

3. The structure of claim 1, wherein when a magnetic field having a strength between zero and a threshold value is applied to the magnetic conductor, the first side of the magnetic conductor has a first magnetic state and the second side of the magnetic conductor has a second magnetic state.

4. The structure of claim 3, wherein when the magnetic field is applied to the magnetic conductor the magnetic conductor is relatively nonconductive.

5. The structure of claim 4, wherein when the strength of the magnetic field is greater than the threshold value, the magnetic conductor is relatively conductive.

6. The structure of claim 3, wherein application to the magnetic conductor of a magnetic field having a strength greater than the threshold value will cause the first side and the second side to have the same magnetic state.

7. The structure of claim 1, further comprising a capping layer covering at least a portion of the second electrode.

8. The structure of claim 1, wherein the magnetic conductor is made from a material for which magnetoresistance magnitude of the material oscillates as a function of the material's cross-section diameter.

9. The structure of claim 8, wherein the cross-section diameter of the magnetic conductor is selected to correspond substantially to a peak of the function.

10. The structure of claim 1, wherein the magnetic conductor comprises a material selected from the group consisting of cobalt, nickel, iron, and alloys of these metals.

11. The structure of claim 1, wherein the magnetic conductor comprises a material selected from the group consisting of nickel-iron, nickel-cobalt, cobalt-iron, chromium dioxide ($CrO_2$), and magnetite ($Fe_3O_4$).

12. The structure of claim 1, wherein the magnetic conductor comprises a ferromagnetic or ferrimagnetic material.

13. A data retrieval device, comprising a conductor having a first side and a second side, the conductor being sized to have a cross-section diameter similar to a Fermi wavelength of electrons in the conductor, the cross-section being taken substantially perpendicular to a primary direction in which current could flow through the conductor, wherein a magnetic state of the first side of the conductor may be selectively different from a magnetic state of the second side of the conductor by whether a magnetic field of sufficient strength is applied to the magnetic conductor.

14. The retrieval device of claim 13, wherein the device is less conductive when the first side has a different magnetic state than the second side.

15. The retrieval device of claim 13, wherein the device is more conductive when the first side and the second side have the same magnetic states.

16. The retrieval device of claim 13, wherein application to the conductor of a magnetic field having a strength greater than a threshold value will cause the first side and the second side to have the same magnetic state.

17. The retrieval device of claim 13, wherein the conductor is made from a material for which magnetoresistance magnitude of the material oscillates as a function of the material's cross-section diameter.

18. The retrieval device of claim 17, wherein the cross-section diameter of the conductor is selected to correspond substantially to a peak of the function.

19. The retrieval device of claim 13, wherein the conductor comprises a material selected from the group consisting of cobalt, nickel, iron, or alloys of these metals.

20. The retrieval device of claim 13, wherein the conductor comprises a material selected from the group consisting of nickel-iron, nickel-cobalt, cobalt-iron, chromium dioxide ($CrO_2$), or magnetite ($Fe_3O_4$).

21. The retrieval device of claim 13, wherein the conductor comprises a ferromagnetic or ferrimagnetic material.

* * * * *

UNITED STATES PATENT AND TRADEMARK OFFICE
CERTIFICATE OF CORRECTION

PATENT NO.        : 7,425,826 B2                                              Page 1 of 1
APPLICATION NO.   : 11/355626
DATED             : September 16, 2008
INVENTOR(S)       : Chopra et al.

It is certified that error appears in the above-identified patent and that said Letters Patent is hereby corrected as shown below:

Column 1, line 6, please insert:

--This invention was made with government support under NSF-DMR-03-05-242 awarded by the National Science Foundation. The government has certain rights in the invention.--

Signed and Sealed this

Seventeenth Day of November, 2009

David J. Kappos
*Director of the United States Patent and Trademark Office*